(12) United States Patent
Ichino et al.

(10) Patent No.: US 9,566,821 B2
(45) Date of Patent: *Feb. 14, 2017

(54) PLASMA PROCESSING APPARATUS AND PLASMA PROCESSING METHOD

(71) Applicant: HITACHI HIGH-TECHNOLOGIES CORPORATION, Tokyo (JP)

(72) Inventors: Takamasa Ichino, Kudamatsu (JP); Ryoji Nishio, Kudamatsu (JP); Shinji Obama, Kudamatsu (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 508 days.

This patent is subject to a terminal disclaimer.

(21) Appl. No.: 13/680,978

(22) Filed: Nov. 19, 2012

(65) Prior Publication Data
US 2013/0075036 A1    Mar. 28, 2013

Related U.S. Application Data

(63) Continuation of application No. 12/193,274, filed on Aug. 18, 2008, now Pat. No. 8,329,054.

(30) Foreign Application Priority Data

Jun. 25, 2008    (JP) ................................ 2008-165214

(51) Int. Cl.
  *C23C 16/50*    (2006.01)
  *C23C 16/00*    (2006.01)
  (Continued)

(52) U.S. Cl.
CPC ............ *B44C 1/227* (2013.01); *H01J 37/321* (2013.01); *H01J 37/32174* (2013.01); *H01L 21/6831* (2013.01); *H01L 21/6833* (2013.01)

(58) Field of Classification Search
USPC ................. 118/715–732; 156/345.24–345.28
See application file for complete search history.

(56) References Cited

U.S. PATENT DOCUMENTS 4,968,374 A    11/1990    Tsukada et al.
5,737,177 A     4/1998    Mett et al.
(Continued)

FOREIGN PATENT DOCUMENTS

JP    2006-210726 A    8/2006
JP    2007-073309 A    3/2007

OTHER PUBLICATIONS

Entire Prosecution History of U.S. Appl. No. 12/192,274, filed Aug. 18, 2008 entitled Plasma Processing Apparatus and Plasma Processing Method.

*Primary Examiner* — Karla Moore
*Assistant Examiner* — Tiffany Nuckols
(74) *Attorney, Agent, or Firm* — McDermott Will & Emery LLP

(57) ABSTRACT

A plasma processing apparatus includes a plasma-generation high-frequency power supply which generates plasma in a processing chamber, a biasing high-frequency power supply which applies high-frequency bias electric power to an electrode on which a sample is placed, a monitor which monitors a peak-to-peak value of the high-frequency bias electric power applied to the electrode, an electrostatic chuck power supply which makes the electrode electrostatically attract the sample, a self-bias voltage calculating unit which calculates self-bias voltage of the sample by monitoring the peak-to-peak value of the high-frequency bias electric power applied to the electrode, and an output voltage control unit which controls output voltage of the electrostatic chuck power supply based on the calculated self-bias voltage.

6 Claims, 7 Drawing Sheets

(51) Int. Cl.
*C23F 1/00* (2006.01)
*H01L 21/306* (2006.01)
*H01J 37/32* (2006.01)
*B44C 1/22* (2006.01)
*H01L 21/683* (2006.01)

(56) References Cited

U.S. PATENT DOCUMENTS

| | | | | |
|---|---|---|---|---|
| 6,005,376 | A | * 12/1999 | Mett | G05F 1/46 323/275 |
| 6,198,616 | B1 | * 3/2001 | Dahimene et al. | 361/234 |
| 6,273,023 | B1 | * 8/2001 | Tsuchihashi | H01J 37/32706 118/712 |
| 6,898,065 | B2 | * 5/2005 | Mays | H01L 21/6833 361/234 |
| 7,224,568 | B2 | 5/2007 | Ishimura et al. | |
| 2002/0037652 | A1 | 3/2002 | Moriya et al. | |
| 2005/0142873 | A1 | * 6/2005 | Shindo | H01J 37/32082 438/680 |
| 2006/0113037 | A1 | * 6/2006 | Nishio | C23F 4/00 156/345.24 |
| 2006/0171093 | A1 | 8/2006 | Ishimura et al. | |
| 2007/0058322 | A1 | 3/2007 | Ito et al. | |
| 2007/0217118 | A1 | * 9/2007 | Ikuhara | H02N 13/00 361/234 |
| 2008/0068774 | A1 | * 3/2008 | Sumiya | H01J 37/32091 361/235 |

* cited by examiner

PLASMA PROCESSING APPARATUS AND PLASMA PROCESSING METHOD

RELATED APPLICATIONS

This application is a Continuation of U.S. application Ser. No. 12/193,274, filed on Aug. 18, 2008, which claims the benefit of Japanese Patent Application No. 2008-165214 filed on Jun. 25, 2008, in the Japanese Intellectual Property Office, the disclosures of which are incorporated herein by reference.

BACKGROUND OF THE INVENTION

The present invention relates to a plasma processing method and a plasma processing apparatus (e.g. plasma etching apparatus) having a mechanism for holding a sample or wafer (semiconductor wafer, liquid crystal substrate, etc.) on an electrode (sample stage) by means of the so-called electrostatic chuck (electrostatic attraction), and in particular, to a plasma processing method and a plasma processing apparatus suitable for reducing damage to the inner wall of the processing chamber of the plasma processing apparatus caused by a rise in plasma potential.

In a plasma processing apparatus such as a plasma etching apparatus, a method called "electrostatic chuck" or "electrostatic attraction" is widely used for holding a wafer in the processing chamber. The electrostatic chuck (electrostatic attraction) is a method of holding a wafer on an electrode (sample stage) by electrostatic force which is caused by the potential difference between the wafer and the electrode. The electrostatic chuck has advantages over mechanical holding methods (using a holding member such as a clamp) in that wafer contamination due to contact can be avoided and wafer temperature control is easy (since the whole of the back of the wafer is attracted). Methods for the electrostatic chuck generally include a monopole method (applying electrostatic chuck voltage to one electrode) and a dipole method (using two or more electrodes and generally applying electrostatic chuck voltages of different polarities to the electrodes, respectively).

FIG. 2 is a schematic diagram showing the general composition of a plasma processing apparatus.

An electrostatic chuck power supply 111 is capable of applying DC voltage to an electrode 108 which is embedded in a sample stage 109. The value of the DC voltage will hereinafter be referred to as "ESC voltage (output voltage) of the electrostatic chuck power supply 111". Average electric potential of the wafer 113 caused by application of output of a biasing high-frequency power supply 110 to the electrode 108 via a capacitor will hereinafter be referred to as "self-bias voltage" ($V_{dc}$). The self-bias voltage $V_{dc}$ is a negative DC voltage. In this case, the potential difference between the electrode 108 and the wafer 113 (i.e. the difference between the ESC voltage and the self-bias voltage $V_{dc}$) is the electrostatic chuck voltage ($V_{chuck}$). The self-bias voltage $V_{dc}$ is dependent on the peak-to-peak value ($V_{pp}$) of the high-frequency bias power applied to the wafer 113 in the following relationship:

$$\alpha = |V_{dc}/V_{pp}| \leq 0.5$$

where $\alpha$ is a constant which can vary depending on the plasma processing apparatus (0.3-0.45 in a standard plasma processing apparatus).

The peak-to-peak value $V_{pp}$ can be monitored with a $V_{pp}$ monitor 112.

FIG. 3 is a graph showing an example of the relationship among the ESC voltage, the self-bias voltage $V_{dc}$, the peak-to-peak value $V_{pp}$ and the electrostatic chuck voltage $V_{chuck}$.

The self-bias voltage $V_{dc}$ appears in the negative region of the graph with an absolute value $\alpha \times V_{pp}$ (positive). As shown in FIG. 3, there exist two ESC voltages that cause the same $V_{chuck}$ with respect to the value of $V_{dc}$. The ESC voltages on the positive side and on the negative side of $V_{dc}$ will hereinafter be expressed as $V_{ESC}^+$ and $V_{ESC}^-$, respectively.

In this case, the relationship among the ESC voltages ($V_{ESC}^+$, $V_{ESC}^-$), the electrostatic chuck voltage $V_{chuck}$ and the self-bias voltage $V_{dc}$ can be expressed by the following equations:

$$V_{ESC}^+ = V_{dc} + V_{chuck}$$

$$V_{ESC}^- = V_{dc} - V_{chuck}$$

where $V_{dc}$ is negative and $V_{chuck}$ is positive.

SUMMARY OF THE INVENTION

The existing plasma processing apparatuses (related arts) involve the following problems regarding the holding of the wafer by means of electrostatic chuck (electrostatic attraction).

First, when the electrostatic chuck voltage $V_{chuck}$ is too low, the wafer, not sufficiently attracted to the electrode, can peel off from the electrode (sample stage) during the plasma processing. On the other hand, when the electrostatic chuck voltage $V_{chuck}$ is too high, chuck force (attracting force) becomes too high and the wafer can be cracked. Therefore, the peeling off and cracking of the wafer have to be prevented by properly adjusting the value of the electrostatic chuck voltage $V_{chuck}$.

Further, when resistance at the inner wall of the processing chamber making contact with the plasma is high, abnormal electric discharge occurs between the plasma and the inner wall.

For example, when plasma 106 for the processing of the wafer 113 is generated by applying positive ESC voltage to the electrode 108 by the monopole method, minute leak current I (indicated with a broken line in FIG. 2) flows into the plasma. When the resistance R of the inner wall of the processing chamber 105 is high, the plasma is electrically charged up to a voltage V=IR (positive), that is, the plasma potential takes on a positive value. When the plasma potential exceeds a certain level, abnormal electric discharge occurs due to electric breakdown of an insulator layer on the inner wall of the processing chamber. Due to foreign materials caused by the abnormal electric discharge, contamination of the wafer and the inside of the processing chamber becomes a problem.

In order to suppress the abnormal electric discharge and the accompanying generation of foreign materials, various techniques for suppressing the rise in the plasma potential (the cause of the abnormal electric discharge) have been proposed.

For example, in a technique described in JP-A-2007-73309, the potential of the wall is measured and the absolute value of the ESC voltage is reduced when abnormal electric discharge is likely to occur.

However, this technique involves problems such as the peeling off of the wafer due to the reduced absolute value of the ESC voltage, unevenness of the plasma processing due to nonuniformity in wafer temperature (caused by changes in the chuck force during the process due to the changing (adjustment) of the ESC voltage during the process), etc.

Meanwhile, a technique described in JP-A-2006-210726 suppresses the rise in the plasma potential by negatively shifting the ESC voltage.

With this technique, however, the voltage applied to the electrode becomes extremely high especially when $V_{pp}$ and $V_{dc}$ are both high, which is undesirable in consideration of dielectric strength of a flame-sprayed film of the electrode head and the transmission system, costs, etc.

It is therefore the primary object of the present invention to provide a plasma processing apparatus and a plasma processing method capable of resolving the above problems, such as the wafer peeling (peeling off of the wafer) caused by insufficient chuck force, the wafer cracking (cracking of the wafer) caused by excessive chuck force, the unevenness of plasma processing, the abnormal electric discharge (due to the rise in the plasma potential) and the accompanying generation of foreign materials, power loss caused by excessive supply voltage, and the problem related to dielectric strength and costs.

In accordance with an aspect of the present invention, there is provided a plasma processing apparatus including a processing chamber in which a sample is processed by plasma generated therein, a first radio-frequency power supply which supplies a first radio-frequency electric power for generating the plasma in the processing chamber, a second radio-frequency power supply which applies a second radio-frequency bias electric power to a stage on which the sample is placed, a monitor which monitors a peak-to-peak value of the second radio-frequency bias electric power applied to the stage, an electrostatic chuck power supply which makes an electrode disposed inside the stage electrostatically attract the sample, an output voltage control unit which is configured to control output voltage of the electrostatic chuck power supply based on the calculated self-bias voltage, wherein the output voltage control unit is configured to set the output voltage of the electrostatic chuck power supply unit at a first negative value during an initial period of generating plasma which is from plasma ignition until a plasma potential becomes stable, and thereafter set the output voltage at a second negative value for processing of the sample which is greater than both of a self-bias voltage of the sample and the first negative value, the second negative value being determined based upon an output from the monitor.

Preferably, when the absolute value of the self-bias voltage is smaller than electrostatic chuck voltage necessary for the attraction of the sample, the output voltage control unit sets the output voltage at (self-bias voltage)−(electrostatic chuck voltage).

Preferably, when the absolute value of the self-bias voltage is larger than electrostatic chuck voltage necessary for the attraction of the sample, the output voltage control unit sets the output voltage at (self-bias voltage)+(electrostatic chuck voltage).

Preferably, when the obtained output voltage is smaller than a prescribed value, the output voltage control unit sets the output voltage at a value which is on the negative side of the self-bias voltage and capable of achieving the electrostatic chuck voltage necessary for the attraction of the sample only at plasma ignition.

Preferably, the plasma processing apparatus further includes a control unit which stops supply of gas to the back of the sample while processing of the sample shifts from a step to the next step in cases where the processing of the sample includes multiple steps which are executed successively and electrostatic chuck voltage varies from step to step.

In accordance with another aspect of the present invention, there is provided a plasma processing method using a plasma processing apparatus equipped with a plasma-generation high-frequency power supply which generates plasma in a processing chamber, a biasing high-frequency power supply which applies high-frequency bias electric power to an electrode on which a sample is placed, a monitor which monitors a peak-to-peak value of the high-frequency bias electric power applied to the electrode, and an electrostatic chuck power supply which makes the electrode electrostatically attract the sample. In the plasma processing method, the electrostatic chuck of the sample is carried out by setting output voltage of the electrostatic chuck power supply at a negative value which is on the positive side of self-bias voltage of the sample.

In accordance with another aspect of the present invention, there is provided a plasma processing method using a plasma processing apparatus equipped with a plasma-generation high-frequency power supply which generates plasma in a processing chamber, a biasing high-frequency power supply which applies high-frequency bias electric power to an electrode on which a sample is placed, a monitor which monitors a peak-to-peak value of the high-frequency bias electric power applied to the electrode, and an electrostatic chuck power supply which makes the electrode electrostatically attract the sample. In the plasma processing method, the electrostatic chuck of the sample is carried out by setting output voltage of the electrostatic chuck power supply at a negative value which is on the negative side of self-bias voltage of the sample at plasma ignition and thereafter setting the output voltage at a negative value which is on the positive side of the self-bias voltage of the sample.

Preferably, supply of gas to the back of the sample is stopped while processing of the sample shifts from a step to the next step in cases where the processing of the sample includes multiple steps which are executed successively and electrostatic chuck voltage varies from step to step.

With the plasma processing apparatus and the plasma processing method in accordance with the present invention, appropriate electrostatic chuck force can be achieved under a condition avoiding the problems with the conventional techniques (abnormal electric discharge due to a rise in the plasma potential and the accompanying generation of foreign materials, the problem related to the dielectric strength of the electrode substrate and the transmission system caused by the application of high voltage).

Further, stable electrostatic chuck force can be achieved without wasting electric power since the wafer can be attracted to the electrode by use of low applied voltage within a permissible range.

Incidentally, while inductively coupled plasma is used as an example in the plasma processing apparatus in the following embodiments, the present invention achieves the same effects even when a generally-used plasma generating unit of a different type (magneto-microwave plasma, etc.) is used.

Other objects, features and advantages of the invention will become apparent from the following description of the embodiments of the invention taken in conjunction with accompanying drawings.

DETAILED DESCRIPTION OF THE EMBODIMENTS

Figure 1:
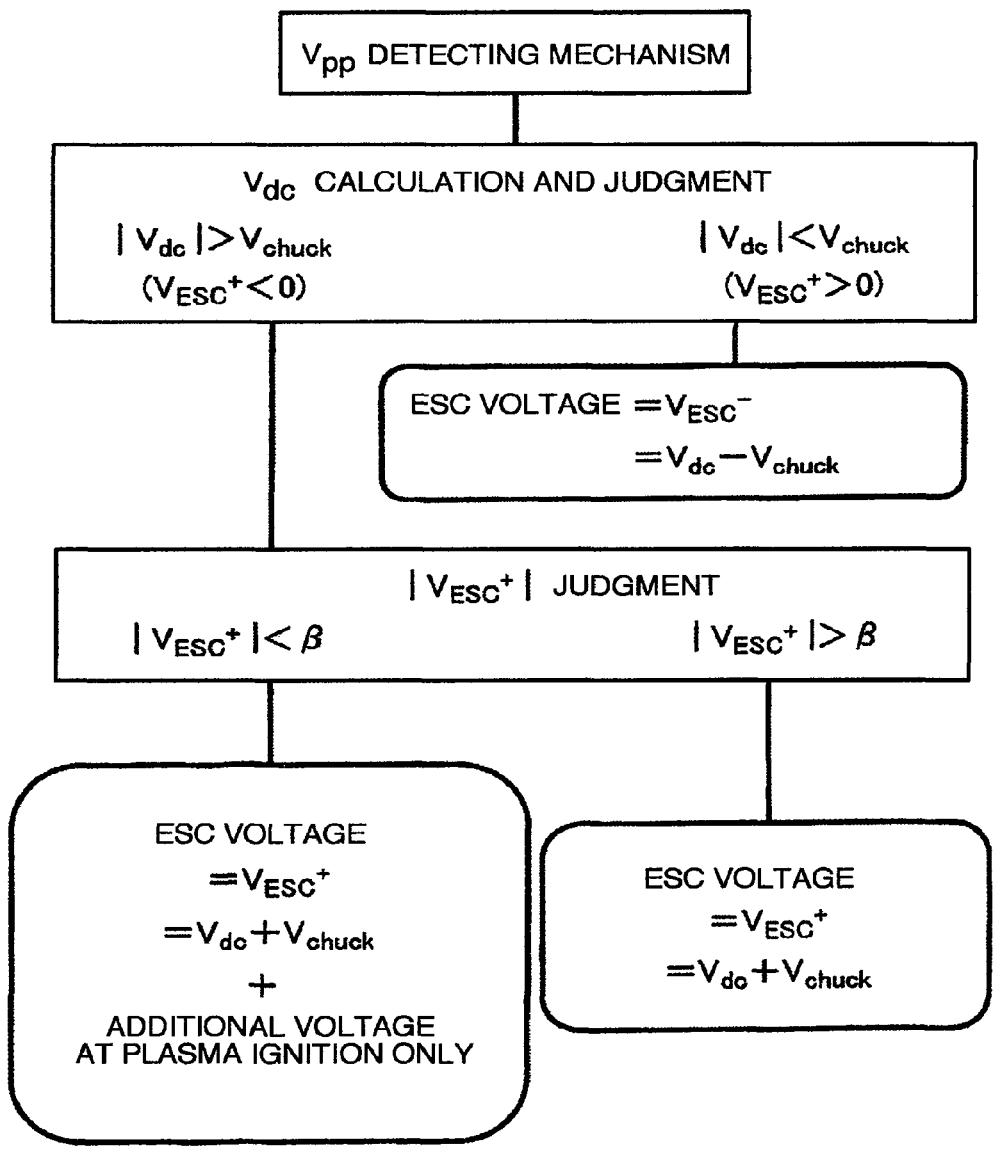
FIG. 1 is a chart showing a method which is used for determining ESC voltage in embodiments in accordance with the present invention.

Referring now to the drawings, a description will be given in detail of preferred embodiments in accordance with the present invention.

In order to resolve the problems with the related art, the present inventors conducted various experiments for studying the relationship between the plasma potential and the ESC voltage (DC voltage outputted by the electrostatic chuck power supply 111 to be applied to the electrode 108).

Figure 4:
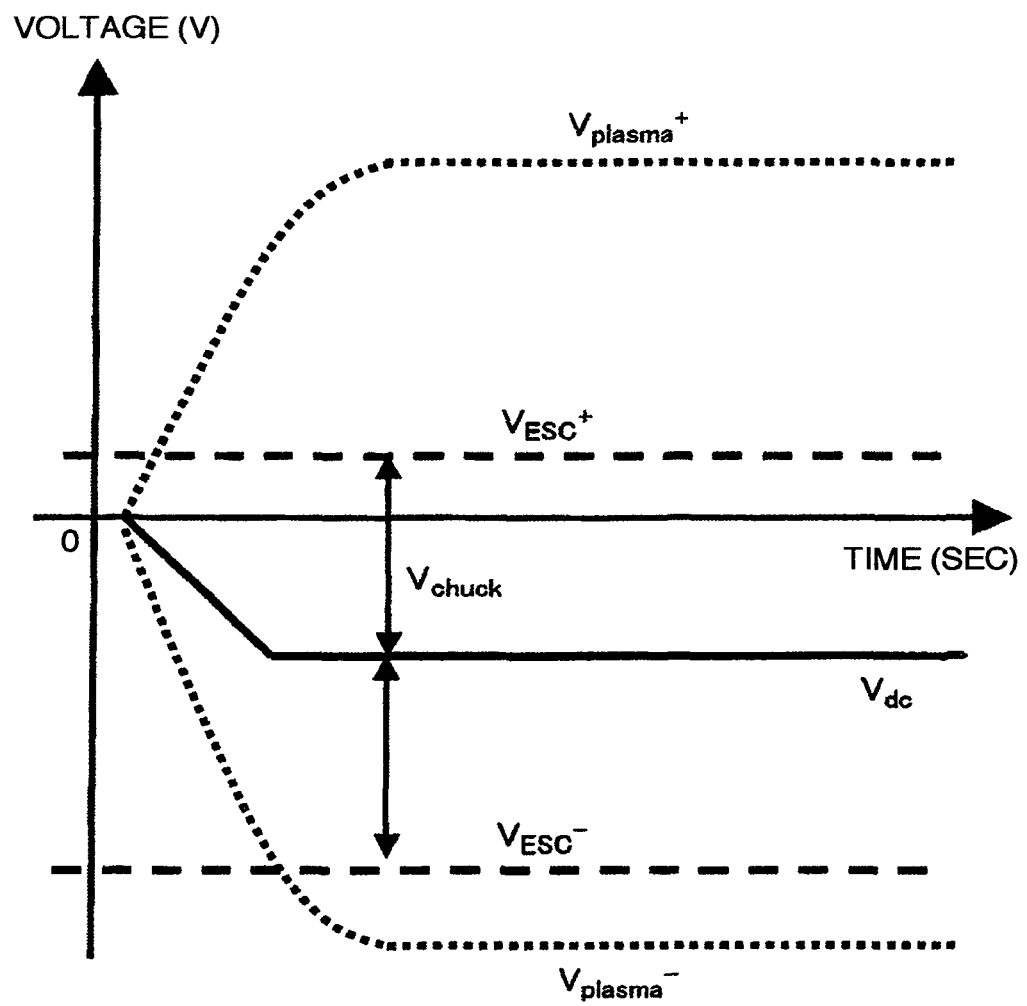
FIG. 4 is a graph showing an example of the relationship between plasma potential and the ESC voltage in a case where the absolute value of the self-bias voltage $V_{dc}$ is smaller than the electrostatic chuck voltage $V_{chuck}$.

FIG. 4 is a graph showing an example of the relationship between the plasma potential and the ESC voltage in a case where the absolute value of the self-bias voltage $V_{dc}$ is smaller than the electrostatic chuck voltage $V_{chuck}$.

In FIG. 4, $V_{plasma}^+$ represents the plasma potential when $V_{ESC}^+$ (ESC voltage on the positive side of $V_{dc}$) is used, and $V_{plasma}^-$ represents the plasma potential when $V_{ESC}^-$ (ESC voltage on the negative side of $V_{dc}$) is used. Under the condition shown in FIG. 4, $V_{ESC}^+$ is positive and $V_{ESC}^-$ is negative.

In this case, a rise in the plasma potential was observed when the positive ESC voltage $V_{ESC}^+$ was used, and it was found that abnormal electric discharge occurs when the plasma potential gets high in the positive region.

Thus, in order to prevent the abnormal electric discharge, the ESC voltage employed has to be changed depending on the behavior of the plasma potential.

In the following, the setting of ESC voltage that is capable of achieving appropriate electrostatic chuck force without causing the abnormal electric discharge (occurring dependent on each value of $V_{ESC}^+$) will be explained with reference to FIGS. 4, 5 and 6.

First, a value of the electrostatic chuck voltage $V_{chuck}$ that can be regarded as optimum is set. The electrostatic chuck voltage $V_{chuck}$ should be set at a value that causes no wafer peeling (peeling off of the wafer) or wafer cracking (cracking of the wafer). The electrostatic chuck voltage "$V_{chuck}$" in the following explanation means this value (a constant which is set here).

Subsequently, the peak-to-peak value $V_{pp}$ of the high-frequency bias electric power applied to the electrode 108 is monitored and the value of the self-bias voltage $V_{dc}$ is calculated from the monitored peak-to-peak value $V_{pp}$ and the preset coefficient $\alpha$ ($\alpha=|V_{dc}/V_{pp}|\leq 5$).

In order to realize the electrostatic chuck (electrostatic attraction) of the wafer 113 by use of $V_{chuck}$ (set value) with respect to the calculated $V_{dc}$, it is necessary to select which of $V_{ESC}^+$ or $V_{ESC}^-$ should be used.

The absolute value of $V_{ESC}^+$ is constantly smaller than that of $V_{ESC}^-$ since $V_{dc}$ is negative. Thus, necessary electric power can be reduced by using $V_{ESC}^+$ instead of using $V_{ESC}^-$. However, the plasma potential $V_{plasma}^+$ becomes positive when $V_{ESC}^+$ is positive as shown in FIG. 4, which involves a possibility of abnormal electric discharge.

On the other hand, the plasma potential $V_{plasma}^-$ is constantly negative since $V_{ESC}^-$ is constantly negative. Thus, the use of $V_{ESC}^-$ involves no danger of abnormal electric discharge.

Based on the above consideration, $V_{ESC}^-$ is used in the following embodiments when $V_{ESC}^+$ is positive (i.e. when $|V_{dc}|<V_{chuck}$).

Figure 5:
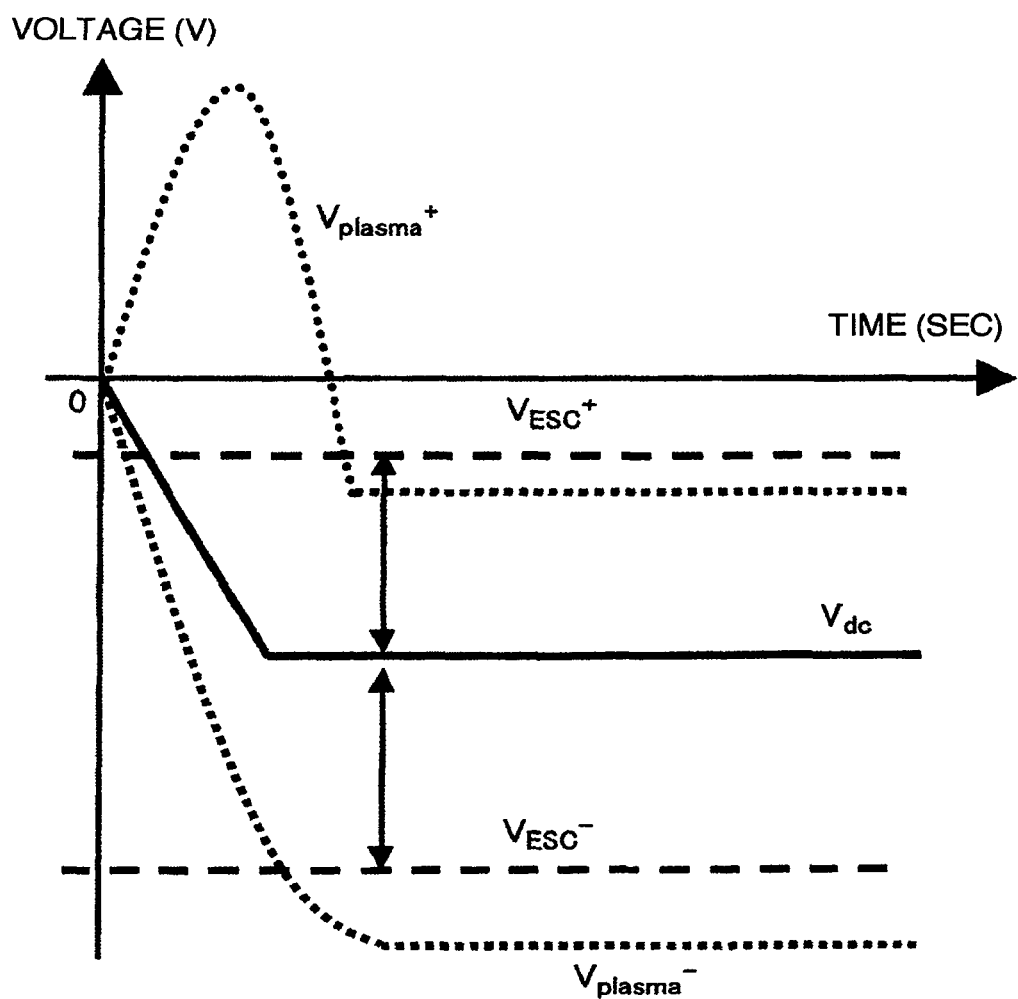
FIG. 5 is a graph showing an example of the relationship between the plasma potential and the ESC voltage in a case where the absolute value of the self-bias voltage $V_{dc}$ is larger than the electrostatic chuck voltage $V_{chuck}$.

FIG. 5 is a graph showing an example of the relationship between the plasma potential and the ESC voltage in a case where the absolute value of the self-bias voltage $V_{dc}$ is larger than the electrostatic chuck voltage $V_{chuck}$.

In this case where $V_{ESC}^+$ is negative (i.e. $|V_{dc}|>V_{chuck}$), $V_{ESC}^+$ and $V_{ESC}^-$ are both negative, which involves no danger of abnormal electric discharge irrespective of whether $V_{ESC}^+$ or $V_{ESC}^-$ is used. Therefore, the use of $V_{ESC}^+$ (having a smaller absolute value than $V_{ESC}^-$) is suitable for realizing smaller output voltage and is advantageous in consideration of the dielectric strength of the electrode substrate and the transmission system, electric power consumption, etc.

In the case where $V_{ESC}^+$ is negative, however, an experiment showed that the plasma potential behaves in two ways (having a positive high-voltage peak or no peak when the plasma is ignited) depending on the absolute value of the employed $V_{ESC}^+$.

In the example shown in FIG. 5, the plasma potential $V_{plasma}^+$ shows a positive high-voltage peak at the plasma ignition and thereafter remains at a negative level (stationary state).

It was found that the positive high-voltage peak at the plasma ignition appears when $|V_{ESC}^+|$ is small and disappears when $|V_{ESC}^+|$ is increased (with $V_{ESC}^+$ in the negative region). From this result, it can be considered that there exist a threshold value of $V_{ESC}^+$ (hereinafter referred to as "$\beta$") for eliminating the positive high-voltage peak at the plasma ignition. It was also found that the threshold value $\beta$ can be estimated by previously conducting an experiment.

Therefore, when the plasma potential $V_{plasma}^+$ has no positive high-voltage peak at the plasma ignition (i.e. when $|V_{ESC}^+|>\beta$), the plasma potential smoothly shifts to the negative region since the plasma ignition and thereafter remains negative, with no problem occurring with the use of $V_{ESC}^+$. Thus, $V_{ESC}^+$ is used in this case.

On the other hand, when the plasma potential $V_{plasma}^+$ has a positive high-voltage peak at the plasma ignition (i.e. when $|V_{ESC}^+|<\beta$), there is a possibility of the aforementioned abnormal electric discharge (even if the positive high-voltage peak appears only at the plasma ignition), which is problematic.

Thus, in order to resolve the problem of the positive high plasma potential at the plasma ignition, an additional voltage, for increasing the absolute value of the ESC voltage ($V_{ESC}^+$) within the negative region, is added to the ESC voltage at the plasma ignition in the following embodiments.

Figure 6:
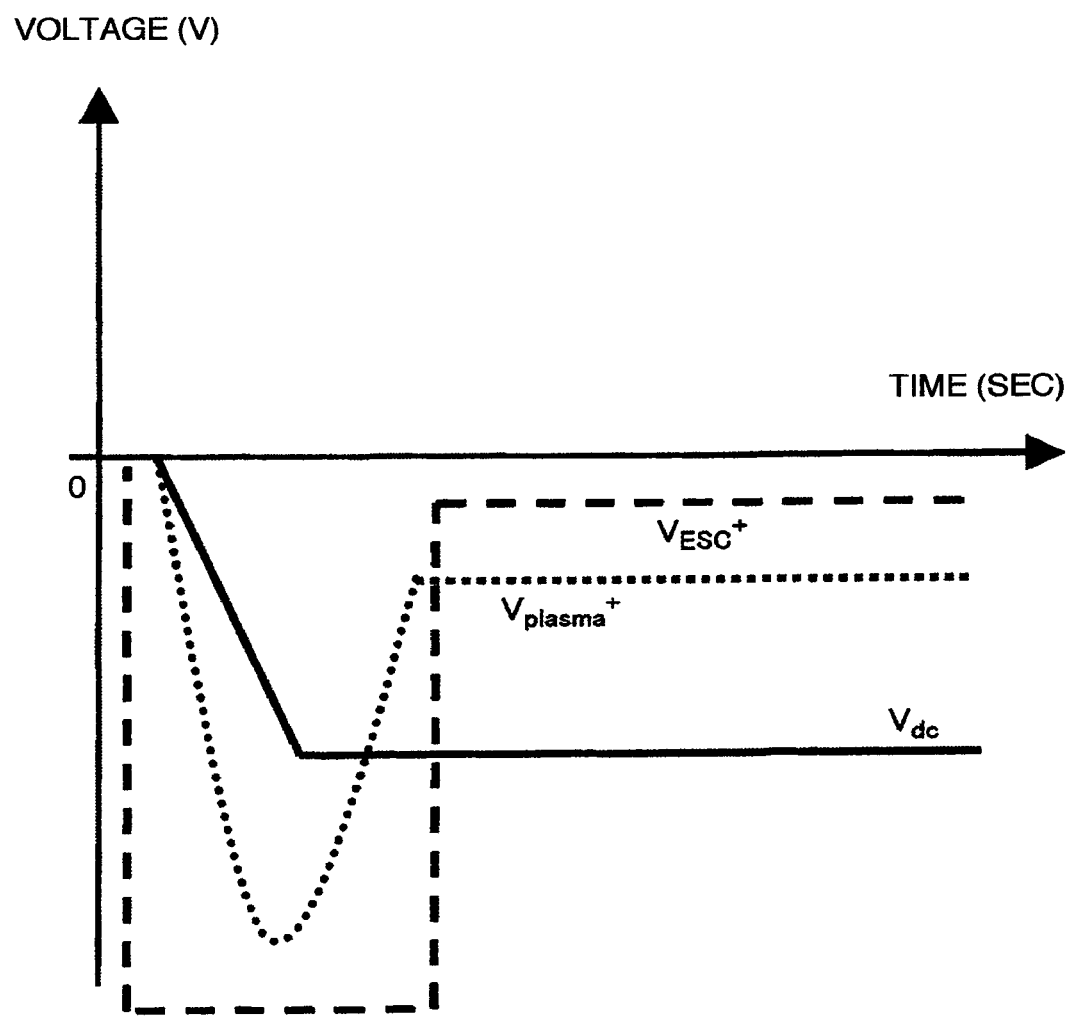
FIG. 6 is a graph showing still another example of the relationship between the plasma potential and the ESC voltage in a case where $V_{ESC}^+$ is negative, $|V_{ESC}^+|<\beta$ and additional voltage is added to the ESC voltage only at plasma ignition.

FIG. 6 is a graph showing an example of the relationship between the plasma potential and the ESC voltage in the case where $V_{ESC}^+$ is negative, $|V_{ESC}^+|<\beta$ and the additional voltage (for increasing the absolute value of the ESC voltage ($V_{ESC}^+$) within the negative region) is added to the ESC voltage only at the plasma ignition.

Thanks to the additional voltage for increasing the absolute value of $V_{ESC}^+$ within the negative region, the positive high plasma potential peak at the plasma ignition (which was seen in FIG. 5) was suppressed successfully and the plasma potential remained constantly in the negative region. Thus, there is no possibility of abnormal electric discharge in this case. A (negative) voltage of approximately $V_{ESC}^-$ or lower can be considered to be sufficient for the additional voltage used at the plasma ignition.

FIG. 1 is a chart showing a method which is used for determining the ESC voltage in the following embodiments.

First, the value of the electrostatic chuck voltage $V_{chuck}$ is set and the self-bias voltage $V_{dc}$ is calculated from the monitored peak-to-peak value $V_{pp}$ and the coefficient $\alpha$ predetermined experimentally or theoretically.

Subsequently, whether $V_{ESC}^+$ is positive or not (i.e. whether $|V_{dc}|<V_{chuck}$ or not) is judged.

When $V_{ESC}^+$ is positive (i.e. $|V_{dc}|<V_{chuck}$), $V_{ESC}^-$ is used as the ESC voltage. When $V_{ESC}^+$ is negative (i.e. $|V_{dc}|>V_{chuck}$), $V_{ESC}^+$ is used as the ESC voltage.

In the case where $V_{ESC}^+$ is used as the ESC voltage, if $|V_{ESC}^+|<\beta$, the additional voltage (for increasing the absolute value of the ESC voltage within the negative region) is added to the ESC voltage $V_{ESC}^+$ at the plasma ignition and thereafter the ESC voltage is set at $V_{ESC}^+$. If $|V_{ESC}^+|>\beta$, the ESC voltage is set constantly at $V_{ESC}^+$ from the plasma ignition. Incidentally, $\beta$ is a preset positive constant.

By determining the ESC voltage according to the above chart, it is possible to provide a plasma processing apparatus and a plasma processing method capable of achieving appropriate electrostatic chuck force without causing abnormal electric discharge.

Embodiment 1

A plasma processing apparatus and a plasma processing method in accordance with a first embodiment of the present invention will be described below with reference to FIGS. 1 and 2.

Figure 2:
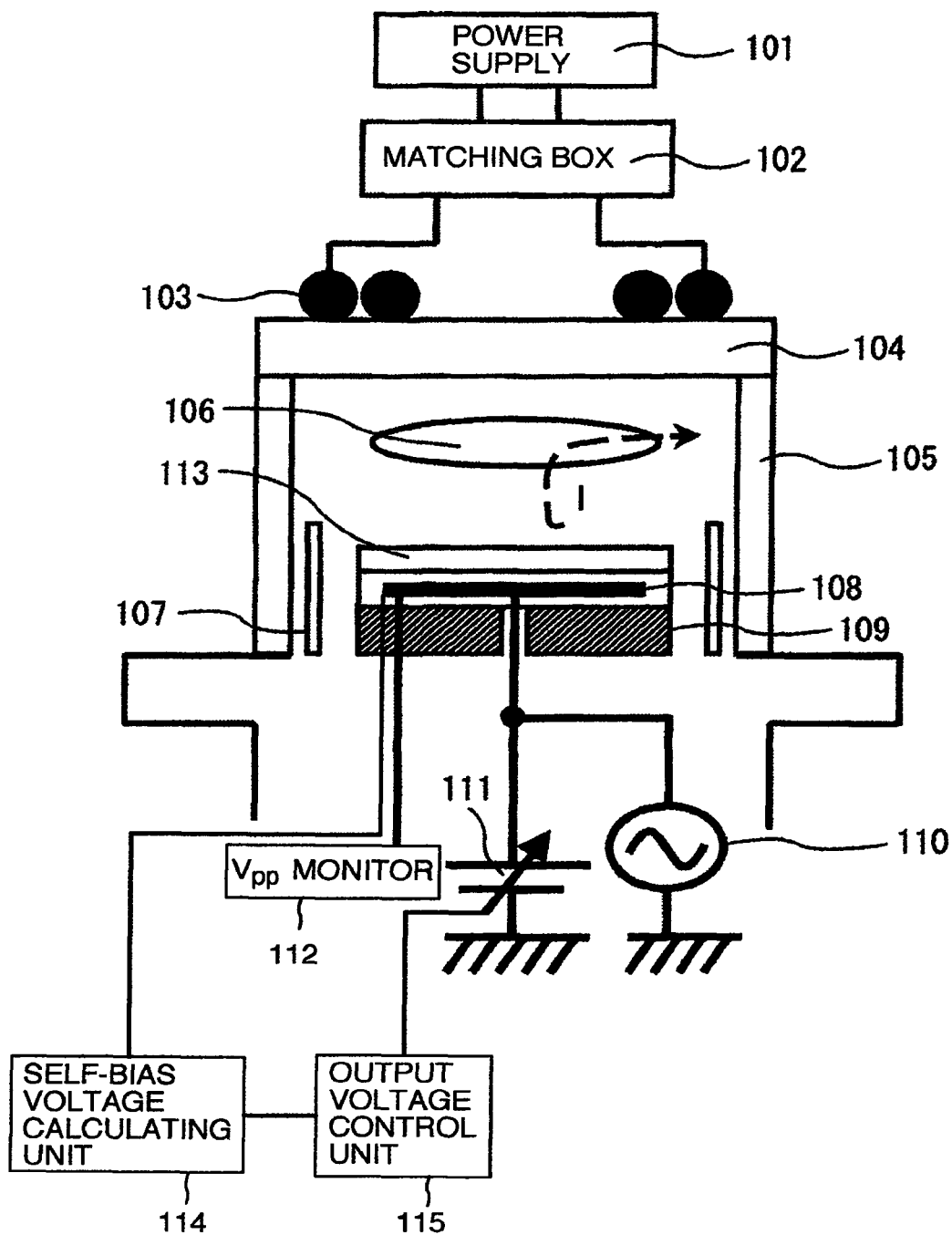
FIG. 2 is a schematic diagram showing the general composition of a plasma processing apparatus.
Figure 3:
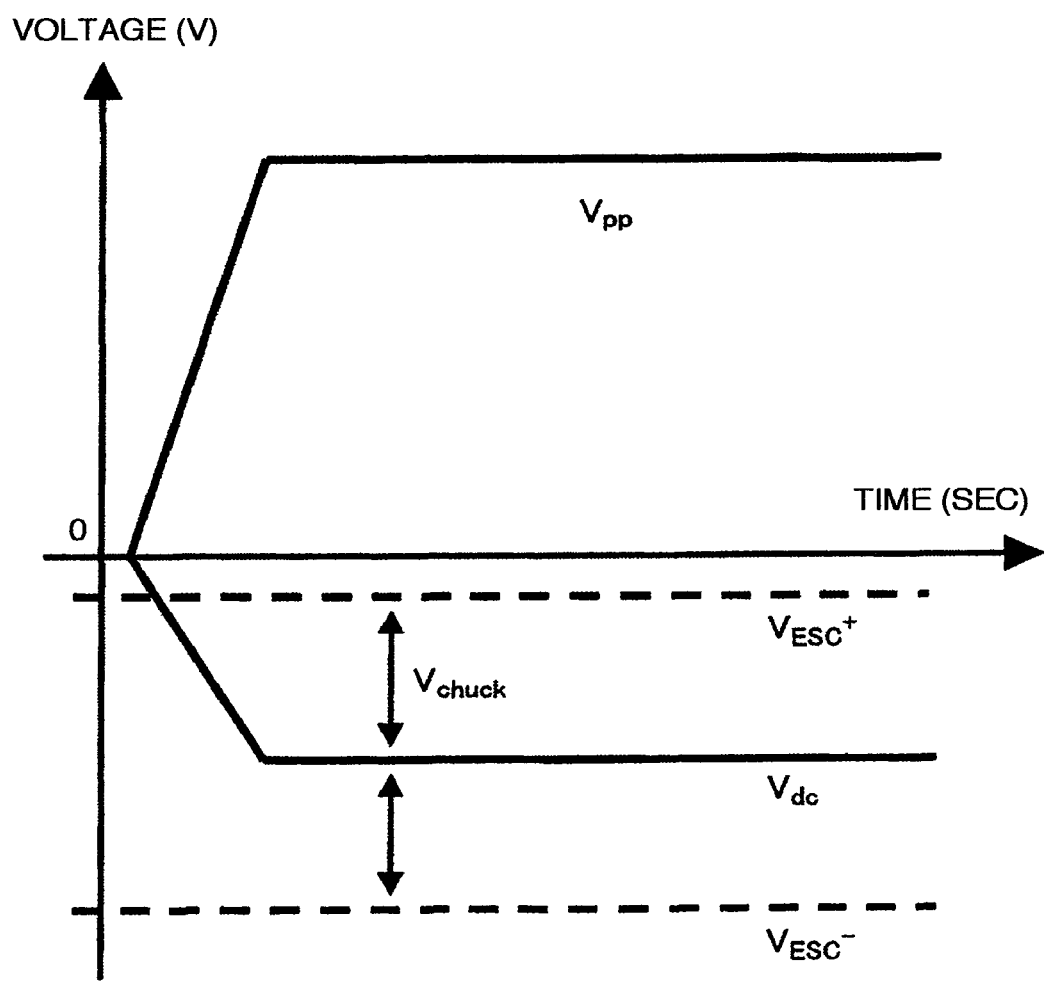
FIG. 3 is a graph showing an example of the relationship among ESC voltage, self-bias voltage $V_{dc}$, a peak-to-peak value $V_{pp}$ and electrostatic chuck voltage $V_{chuck}$.

Referring to FIG. 2, the plasma processing apparatus of this embodiment includes a plasma-generation high-frequency power supply 101 for generating plasma in a processing chamber 105, a biasing high-frequency power supply 110 for applying high-frequency bias electric power to an electrode 108 on which a wafer 113 is placed, a $V_{pp}$ monitor 112 for monitoring the peak-to-peak value $V_{pp}$ of the high-frequency bias electric power applied to the electrode 108, an electrostatic chuck power supply 111 for making the electrode 108 (sample stage 109) electrostatically attract the wafer 113, a self-bias voltage calculating unit 114 for calculating the self-bias voltage $V_{dc}$ of the wafer 113 by monitoring the peak-to-peak value $V_{pp}$ of the high-frequency bias electric power applied to the electrode 108, and an output voltage control unit 115 for controlling the output voltage of the electrostatic chuck power supply 111 (ESC voltage) based on the calculated self-bias voltage $V_{dc}$. The wafer 113 held on the electrode 108 (sample stage 109) by the electrostatic chuck force is treated with plasma (plasma treatment). In the figure, a reference numeral 103 depicts an antenna, 104 an inductive coupling window and 107 a ground electrode.

The value of the output voltage of the electrostatic chuck power supply 111 (ESC voltage) is determined by use of the monitored peak-to-peak value $V_{pp}$, the electrostatic chuck voltage $V_{chuck}$ which has previously been set, and the coefficients $\alpha$ and $\beta$ which have previously been measured or set.

A case where $V_{chuck}$=300 V, $\alpha$=0.4 and $\beta$=200 V will be described below as an example.

When the measured peak-to-peak value $V_{pp}$ is 300 V, the self-bias voltage calculating unit 114 calculates the self-bias voltage $V_{dc}$ as −120 V. Since $|V_{dc}|<V_{chuck}$ (i.e. $V_{ESC}^+>0$) holds, the output voltage control unit 115 sets the ESC voltage at $V_{ESC}^-=V_{dc}-V_{chuck}=-420$ V.

When the measured peak-to-peak value $V_{pp}$ is 1000 V, the self-bias voltage calculating unit 114 calculates the self-bias voltage $V_{dc}$ as −400 V. Since $|V_{dc}|>V_{chuck}$ (i.e. $V_{ESC}^+<0$) holds, the output voltage control unit 115 uses $V_{ESC}^+$ (=$V_{dc}$+$V_{chuck}$=−100 V) as the ESC voltage. In this case, $|V_{ESC}^+|<\beta$ holds (since $V_{ESC}^+$=−100 V and $\beta$=200 V), and thus the output voltage control unit 115 executes the control to add the additional voltage (approximately $V_{ESC}^-=V_{dc}-V_{chuck}=-700$ V) to the ESC voltage $V_{ESC}^+$ only at the plasma ignition.

When the measured peak-to-peak value $V_{pp}$ is 2000 V, the self-bias voltage calculating unit 114 calculates the self-bias voltage $V_{dc}$ as −800 V. Since $|V_{dc}|>V_{chuck}$ (i.e. $V_{ESC}^+<0$) holds, the output voltage control unit 115 uses $V_{ESC}^+$ (=$V_{dc}$+$V_{chuck}$=−500 V) as the ESC voltage. In this case, the additional voltage at the plasma ignition is unnecessary since $|V_{ESC}^+|>\beta$ holds (since $V_{ESC}^+$=−500 V and $\beta$=200 V), and thus the output voltage control unit 115 sets the output voltage (ESC voltage) at $V_{ESC}^+$=−500 V from the plasma ignition.

By controlling the ESC voltage as in the above examples, the electrostatic chuck voltage is maintained constantly at the set value $V_{chuck}$, by which the wafer peeling and the wafer cracking are avoided. Further, the abnormal electric discharge is eliminated since the aforementioned rise in the plasma potential due to positive leak current is prevented.

Embodiment 2

A plasma processing apparatus and a plasma processing method in accordance with a second embodiment of the present invention will be described below with reference to FIG. 7.

In this embodiment, a case where the processing of the wafer includes multiple steps which are executed successively and the peak-to-peak value $V_{pp}$ (of the high-frequency bias electric power applied to the electrode 108) varies from step to step will be described.

Figure 7:
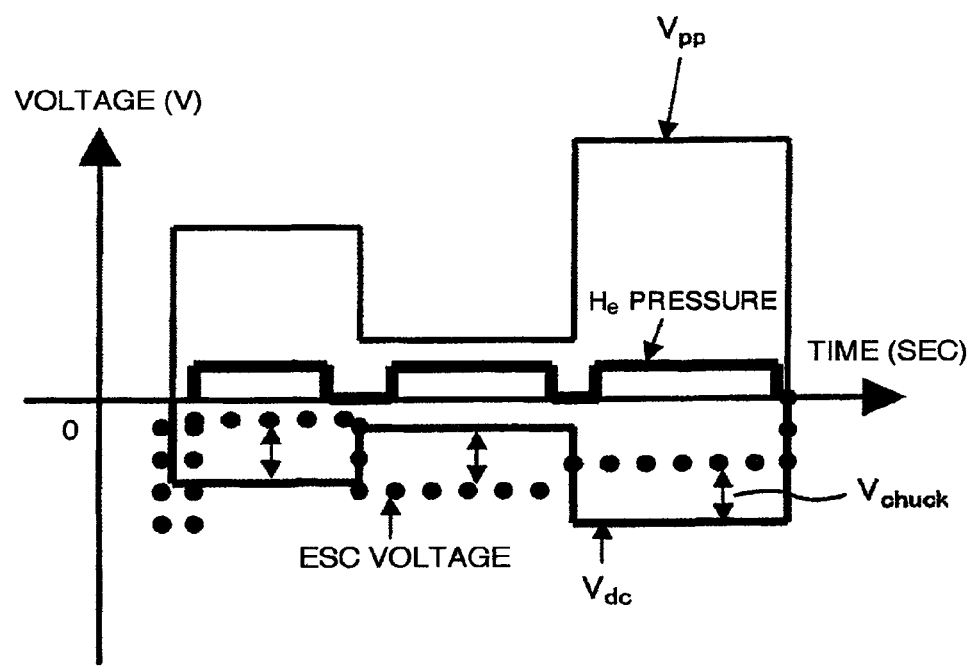
FIG. 7 is a graph showing an example of the relationship among the ESC voltage, the self-bias voltage $V_{dc}$, the peak-to-peak value $V_{pp}$, the electrostatic chuck voltage $V_{chuck}$ and gas pressure on the back of the wafer.

FIG. 7 is a graph showing an example of the relationship among the ESC voltage, the self-bias voltage $V_{dc}$, the peak-to-peak value $V_{pp}$, the electrostatic chuck voltage and gas pressure on the back of the wafer.

In the case where multiple steps differing in the peak-to-peak value $V_{pp}$ are executed successively, the electrostatic chuck (electrostatic attraction) of the wafer has to be carried out in each step by use of an ESC voltage suitable for the peak-to-peak value $V_{pp}$ in the step, that is, an ESC voltage capable of achieving appropriate electrostatic chuck force without causing the abnormal electric discharge.

In this case, a problem can occur when the employed ESC voltage is changed from $V_{ESC}^+$ to $V_{ESC}^-$ or from $V_{ESC}^-$ to $V_{ESC}^+$ in the transition between two consecutive steps.

For example, a case where $V_{chuck}$=300 V, $\alpha$=0.4 and $\beta$=200 V (the aforementioned condition) will be considered below.

When two successive steps in which the peak-to-peak value $V_{pp}$ changes from 300 V to 1000 V are executed, the self-bias voltage $V_{dc}$ changes from −120 V to −400 V. According to the chart of FIG. 1, the ESC voltage changes continuously from −420 V to −100 V in this case. Since the plasma changes continuously, no positive high plasma potential (like that appearing at the plasma ignition) occurs in the transition between the two steps. Thus, in the process in which the ESC voltage changes, there is a point in time when the ESC voltage becomes equal to $V_{dc}$ or the difference between $V_{dc}$ and the ESC voltage becomes smaller than $V_{chuck}$. At this point, the electrostatic chuck (electrostatic attraction) of the wafer becomes insufficient, and in the plasma processing apparatus in which gas (e.g. He) is supplied to the back of the wafer (for the purpose of temperature control, chuck force measurement, etc.), trouble such as wafer peeling or wafer flying can be caused by the pressure of the gas (e.g. He).

In this embodiment which is designed to resolve the above problem, when the employed ESC voltage is changed from $V_{ESC}^+$ to $V_{ESC}^-$ or from $V_{ESC}^-$ to $V_{ESC}^+$ in the transition between steps, a control unit 116 (unshown) stops the supply of the gas (e.g. He) to the back of the wafer (a step of removing the gas on the back of the wafer) before the transition as shown in FIG. 7.

By the above step, the gas on the back of the wafer is removed when the ESC voltage is changed. Consequently, the ESC voltage can be changed safely without the danger of wafer peeling, wafer flying, etc.

It should be further understood by those skilled in the art that although the foregoing description has been on embodiments of the invention, the invention is not limited thereto and various changes and modifications may be made without departing from the spirit of the invention and the scope of the appended claims.

The invention claimed is:

1. A plasma processing apparatus comprising:
a processing chamber in which a sample is processed by plasma generated therein; a first radio-frequency power supply which supplies a first radio-frequency electric power for generating the plasma in the processing chamber;
a second radio-frequency power supply which applies a second radio-frequency bias electric power to a stage on which the sample is placed;
a monitor which monitors a peak-to-peak value of the second radio-frequency bias electric power applied to the stage;
an electrostatic chuck power supply which makes an electrode disposed inside the stage electrostatically attract the sample;
a self-bias voltage calculating unit which calculates self-bias voltage of the sample by monitoring the peak-to-peak value of the ratio-frequency bias-electric power applied to the electrode; and
an output voltage control unit which is configured to control output voltage of the electrostatic chuck power supply based on the calculated self-bias voltage,
wherein the output voltage control unit is configured to set the output voltage of the electrostatic chuck power supply unit at a first negative value during an initial period of generating plasma which is from after plasma ignition until a plasma potential becomes stable, and thereafter set the output voltage at a second negative value for processing of the sample which is greater than both of a self-bias voltage of the sample and the first negative value, the second negative value being determined based upon an output from the monitor.

2. The plasma processing apparatus according to claim 1, wherein when an absolute value of the self-bias voltage is smaller than electrostatic chuck voltage necessary for the attraction of the sample after the initial period, the output voltage control unit sets the output voltage at (self-bias voltage)−(electrostatic chuck voltage).

3. The plasma processing apparatus according to claim 1, wherein when an absolute value of the self-bias voltage is larger than electrostatic chuck voltage necessary for the attraction of the sample after the initial period, the output voltage control unit sets the output voltage at (self-bias voltage)+(electrostatic chuck voltage).

4. The plasma processing apparatus according to claim 3, wherein when an absolute value of the obtained output voltage is smaller than a prescribed value at plasma ignition, the output voltage control unit sets the output voltage at a value which is on the negative side of the self-bias voltage and capable of achieving the electrostatic chuck voltage necessary for the attraction of the sample only at plasma ignition.

5. The plasma processing apparatus according to claim 1, further comprising a control unit which is configured to stop supply of gas to the back of the sample while processing of the sample shifts from a step to the next step in cases where the processing of the sample includes multiple steps which are executed successively and electrostatic chuck voltage varies from step to step.

6. The plasma processing apparatus according to claim 1, wherein the output voltage control unit is configured to set the output voltage of the electrostatic chuck power supply unit, during the predetermined period after the plasma ignition, less than the plasma potential.

* * * * *